US008896472B2

(12) United States Patent
Seo et al.

(10) Patent No.: US 8,896,472 B2
(45) Date of Patent: Nov. 25, 2014

(54) LOW GLITCH-NOISE DAC

(71) Applicant: QUALCOMM Incorporated, San Diego, CA (US)

(72) Inventors: Dongwon Seo, San Diego, CA (US); Sang Min Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/791,536

(22) Filed: Mar. 8, 2013

(65) Prior Publication Data

US 2014/0253357 A1 Sep. 11, 2014

(51) Int. Cl.
*H03M 1/66* (2006.01)
*H03M 1/78* (2006.01)

(52) U.S. Cl.
CPC ................................ *H03M 1/785* (2013.01)
USPC .......................................... 341/145; 341/144

(58) Field of Classification Search
USPC .................. 341/144, 145, 154, 153, 120, 118
See application file for complete search history.

(56) References Cited

U.S. PATENT DOCUMENTS

| 6,583,744 | B2 * | 6/2003 | Bright | 341/145 |
|---|---|---|---|---|
| 6,642,867 | B1 * | 11/2003 | Chowdhury et al. | 341/118 |
| 6,650,265 | B1 * | 11/2003 | Bugeja | 341/144 |
| 6,703,956 | B1 * | 3/2004 | Mueller et al. | 341/145 |
| 7,132,970 | B2 * | 11/2006 | Pan | 341/154 |
| 7,646,322 | B2 | 1/2010 | Lu et al. | |
| 7,893,774 | B2 * | 2/2011 | Kitayama et al. | 331/17 |
| 8,169,353 | B2 | 5/2012 | Seo et al. | |
| 2003/0001766 | A1 | 1/2003 | Song | |
| 2011/0273317 | A1 | 11/2011 | Nagatani et al. | |
| 2012/0050085 | A1 | 3/2012 | Kon | |
| 2013/0169461 | A1 | 7/2013 | Sienko | |

OTHER PUBLICATIONS

Chin, S-Y., et al., "A 10-b 125-MHz CMOS digital-to-analog converter (DAC) with threshold-voltage compensated current sources," Solid-State Circuits, IEEE Journal of, vol. 29, No. 11, pp. 1374-1380, 1994.
Khanoyan, K., et al., "A 10 b, 400 MS/s glitch-free CMOS D/A converter," in VLSI Circuits, 1999. Digest of Technical Papers. 1999 Symposium on, 1999, pp. 73-76.
Marche, D., et al., "An Improved Switch Compensation Technique for Inverted R-2R Ladder DACs," Circuits and Systems I: Regular Papers, IEEE Transactions on, vol. 56, No. 6, pp. 1115-1124, 2009.

(Continued)

*Primary Examiner* — Peguy Jean Pierre
(74) *Attorney, Agent, or Firm* — Patterson & Sheridan, L.L.P.

(57) ABSTRACT

An N-bit digital-to-analog converter (DAC) includes N input stages each of which generates the same amount of current and includes a pair of similarly sized transistor switches responsive to differential bits. The $2^M-1$ input stages associated with the M most significant bits of the DAC are connected in parallel and deliver their currents differentially to the DAC's current summing nodes. Each of the remaining (N−M) stages includes a resistive network that supplies a current defined by a binary weight of the stage's bit position within the DAC. The (N−M) stages deliver their currents to the current summing nodes differentially. The DAC further includes an impedance attenuator adapted to maintain the impedance of the current summing nodes and the voltage difference between the current summing nodes within a range defined by a gain of a differential amplifier disposed in the impedance attenuator.

44 Claims, 12 Drawing Sheets

(56) References Cited

OTHER PUBLICATIONS

Mercer, D.A., "Low-Power Approaches to High-Speed Current-Steering Digital-to-Analog Converters in 0.18-μm CMOS," IEEE Journal of Solid-State Circuits, vol. 42, No. 8, Aug. 2007, pp. 1688-1698.

Shen, V., et al., "A 60ns glitch free NMOS DAC," in Solid-State Circuits Conference. Digest of Technical Papers. 1983 IEEE International, 1983, vol. XXVI, pp. 188-189.

Takakura, H., et al., "A 10 bit 80 MHz glitchless CMOS D/A converter," in Custom Integrated Circuits Conference, 1991., Proceedings of the IEEE 1991, pp. 26.5/1-26.5/4.

Tsai, J., et al., "A 14-bit 200MS/s Current-Steering DAC Achieving over 82dB SFDR with Digitally-Assisted Calibration and Dynamic Matching Techniques," Apr. 2012, 2012 International Symposium on VLSI Design, Automation, and Test (VLSI-DAT), 1-4.

International Search Report and Written Opinion—PCT/US2014/020373—ISA/EPO—Aug. 11, 2014.

* cited by examiner

LOW GLITCH-NOISE DAC

BACKGROUND

The present disclosure relates to electronic circuits, and more particularly to a digital-to-analog converter.

A digital-to-analog converter (DAC) is an electronic circuit that converts a digital signal to an analog signal. A number of parameters are used to determine the suitability of a DAC for any given application. Among these parameters are the speed at which the DAC performs the digital-to-analog conversion, the resolution of the DAC, as well as the noise generated by the DAC.

A wireless communication device, such as a cellular phone, often uses a high speed, high resolution DAC to convert a digital signal to an analog signal for further processing by the analog circuits disposed in the communication device. Glitches generated in such a DAC increase the noise floor, which in turn may interfere with the signals transmitted by the wireless communication device. One of the main sources of the glitch noise is the delay differences that exist between various stages of the DAC when a transition occurs at the digital input of the DAC.

Low noise, low power, wideband, high resolution DACs are increasingly important for advanced wireless standards, such as the long term evolution (LTE) standard. In radio frequency (RF) applications, the high frequency glitch noise generated by the transmitter DAC is an out-of-band noise that can fall into and desensitize the receiver channel. Controlling the glitch noise in a low-power, high resolution, wideband DAC remains a challenge.

BRIEF SUMMARY

A digital-to-analog converter (DAC), in accordance with embodiment of the present invention, includes input stages that generate the same amount of current and have similarly sized transistor switches. The currents flowing through the transistor switches and the glitch noise are therefore the same for all the input stages of the DAC. Input stages corresponding to the least significant bits of the DAC include resistive networks. The resistive network in each such stage scales the current it receives in accordance with the binary weight of the stage's bit position within the DAC.

An N-bit DAC, in accordance with one embodiment of the present invention, includes, in part, $2^M-1$ parallel stages associated with the M most significant bits of the DAC, (N−M) stages associated with the (N−M) least significant bits of the DAC, and an impedance attenuator. Each of the $2^M-1$ stages includes a pair of switches and is adapted to generate the same current and deliver this current to a pair of current summing nodes of the DAC via its switch pair. Each of the (N−M) stages includes a resistive network and generates the same current as that generated in the $2^M-1$ stages. Each of the (N−M) stages further includes a pair of switches which have the same size as the switches in the MSB stages and are adapted to deliver the current generated in that stage to the resistive network associated with the stage in response to differential data. Each resistive network is operable to scale the current it receives in accordance with a binary weight of its associated stage. The (N−M) stages deliver their scaled currents to the pair of current summing nodes. The impedance attenuator includes, in part, a differential amplifier coupled to the current summing nodes and adapted to maintain the impedance of each of the current summing nodes and a voltage difference between the current summing nodes within a range defined by the gain of the differential amplifier.

In one embodiments, the resistive networks associated with input stages whose bit positions are different by one DAC bit are coupled to one another. In one embodiment, each resistive network receives a reference voltage. In yet another embodiment, each resistive network is an R-2R network.

In one embodiment, the impedance attenuator further includes, in part, first and second PMOS transistors. The first PMOS transistor has a source terminal coupled to a first current summing node, a drain terminal coupled to a first output terminal of the DAC, and a gate terminal coupled to a first output terminal of the amplifier. The second PMOS transistor has a source terminal coupled to a second current summing node, a drain terminal coupled to a second output terminal of the DAC, and a gate terminal coupled to a second output terminal of the amplifier.

In one embodiment, each of the N stages of the DAC includes a cascode current source that generates the same current passing though the transistor switches of that stage. In one embodiment, one of the transistor switches in each of the N stages is responsive to a bit representative of a true data bit received by the DAC. The other transistor switch in each of the N stages is responsive to a bit representative of a complement of the bit received by the DAC.

In one embodiment, the resistive network associated with each of only a first subset of the (N−M) stages is an R-2R network. In another embodiment, the resistive network associated with each of a second subset of the (N−M) stages is coupled to the current summing nodes of the DAC. The second subset does not include the first subset.

In one embodiment, at least one of the (N−M) stages further includes a voltage tracking circuit adapted to track the voltages of the current summing nodes and supply the tracked voltages to the resistive network of that stage. In one embodiment, the voltage tracking circuit includes first and second amplifiers. The first amplifier has a first input terminal coupled to the first current summing node, a second input terminal coupled to a first resistive element disposed in the resistive network of that stage, and an output terminal coupled to the first amplifier's second input terminal. The second amplifier has a first input terminal coupled to the second current summing node, a second input terminal coupled to a second resistive element disposed in the resistive network of that stage, and an output terminal coupled to the second amplifier's second input terminal.

In one embodiment, at least one of the (N−M) stages of the DAC further includes a distortion cancellation circuit adapted to cancel the current flow between a reference voltage supplying voltage to the resistive network of that stage and the current summing nodes. In one embodiment, at least one of the $2^M-1$ stages of the DAC further includes first and second resistive elements. The first resistive element is disposed between one of the transistor switches of that stage and the first current summing node. The second resistive element is disposed between another one of the transistor switches of that stage and the second current summing node.

In one embodiment, each of the (N−M) stages further includes first and second capacitive elements. The first capacitive element of each such stage is coupled in parallel between the terminals of a first resistive element disposed in the resistive network of that stage. The second capacitive element of each such stage is coupled in parallel between the terminals of a second resistive element disposed in the resistive network of that stage. In such embodiments, the first and second capacitive elements of each such stage has a capacitance substantially twice a drain-to-substrate capacitance of an MOS transistor switch disposed in the DAC.

A method of converting an N-bit digital signal to an analog signal, in accordance with one embodiment of the present invention includes, in part, forming $2^M-1$ parallel stages associated with M most significant bits of the digital data, generating the same current in each of the $2^M-1$ stages, and delivering the currents from the $2^M-1$ stages to first and second current summing nodes via a pair of switches disposed in each such stage. The method further includes, forming (N−M) stages associated with (N−M) least significant bits of the digital data, and generating in each of the (N−M) stages a current that is the same as the current generated in each of the $2^M-1$ stages. The method further includes forming (N−M) resistive networks each associated with a different one of the (N−M) stages, delivering to each of the (N−M) resistive networks the current generated in its associated stage via a pair of switches, scaling the current received by each resistive network in accordance with a binary weight of the resistive network's associated stage, and delivering the scaled currents to the pair of current summing nodes. The method further includes maintaining the impedance of each of the current summing nodes within a range defined by a gain value, and maintaining the voltage difference between the current summing nodes within a range defined by the gain value. The difference in the currents delivered to the current summing nodes define the value of the analog signal.

BRIEF DESCRIPTION OF THE DRAWINGS

Aspects of the disclosure are illustrated by way of example. In the accompanying figures, like reference numbers indicate similar elements, and.

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure.

A digital-to-analog converter (DAC), in accordance with embodiment of the present invention, includes input stages that generate the same amount of current and have similarly sized transistor switches. The currents flowing through the transistor switches are therefore the same for all the input stages of the DAC. Input stages corresponding to the least significant bits of the DAC include resistive networks. The resistive network in each such stage scales the current it receives in accordance with the binary weight of the stage's bit position within the DAC.

Figure 1:
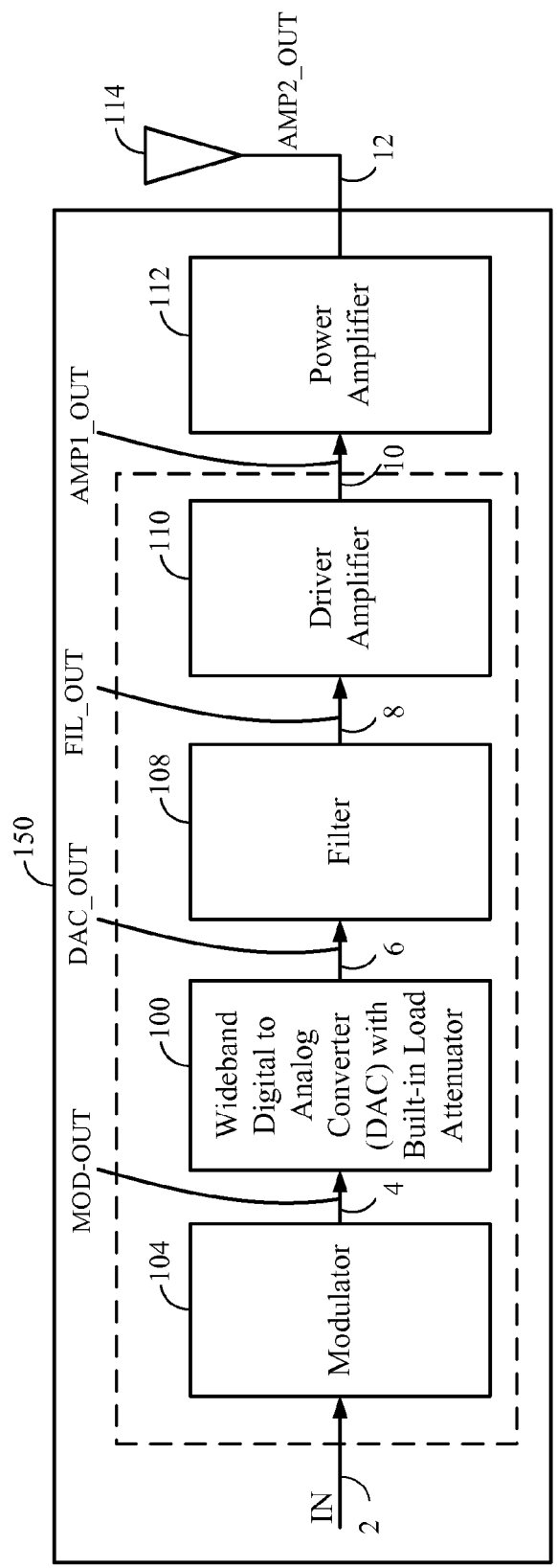
FIG. 1 is a block diagram of a wireless communication device in which various aspects of the present invention may be embodied.

FIG. 1 is a block diagram of a wireless communication device 150 (hereinafter alternatively referred to as device) used in a wireless communication system, in accordance with one embodiment of the present invention. Device 150 may be a cellular phone, a personal digital assistant (PDA), a modem, a handheld device, a laptop computer, and the like.

Device 150 may communicate with one or more base stations on the downlink (DL) and/or uplink (UL) at any given time. The downlink (or forward link) refers to the communication link from a base station to the device. The uplink (or reverse link) refers to the communication link from the device to the base station.

A wireless communication system may be a multiple-access system capable of supporting communication with multiple users by sharing the available system resources (e.g., bandwidth and transmit power). Examples of such systems include code division multiple access (CDMA) systems, time division multiple access (TDMA) systems, frequency division multiple access (FDMA) systems, orthogonal frequency division multiple access (OFDMA) systems, and spatial division multiple access (SDMA) systems.

Wireless communication device 150 may be used in wireless communication systems such as the long term evolution (LTE) systems. Wireless communication system 150 may be continuously operated at high data rates or bandwidths, thus requiring an increased bandwidth for the DACs used therein. An increased bandwidth may require a wideband DAC implemented on a system-on-a-chip capable of handling a wide range of frequencies and digital pre-distortion operations. The pre-distortion operation may enable the use of low-cost non-linear power amplifiers in such wireless systems.

Device 150 is shown as including, in part, modulator 104, DAC 100, filter 108 and amplifier 110, which collectively form a transmission channel. Modulator 104 is adapted to modulate incoming digital signal IN 2 and in response generate and supply the modulated signal MOD_OUT 4 to DAC 100. As described further below, DAC 100 has a built-in load (impedance) attenuator. The converted signal DAC_OUT 6 supplied by DAC 100 is received and filtered by filter 108. The output signal FIL_OUT 8 of filter 108 is received and amplified by amplifier 110, which in response generates signal AMP1_OUT 10. Signal AMP1_OUT generated by amplifier 110 may be further amplified using a power amplifier 112 to generate signal AMP2_OUT before being transmitted by antenna 114.

Low-power wireless or consumer devices may require a DAC that operates with less current. In such applications, the dynamic linearity performance metrics that include the signal-to-noise distortion ratio (SNDR), spurious free dynamic range (SFDR) and total harmonic distortion (THD) are important system parameters.

Figure 2:
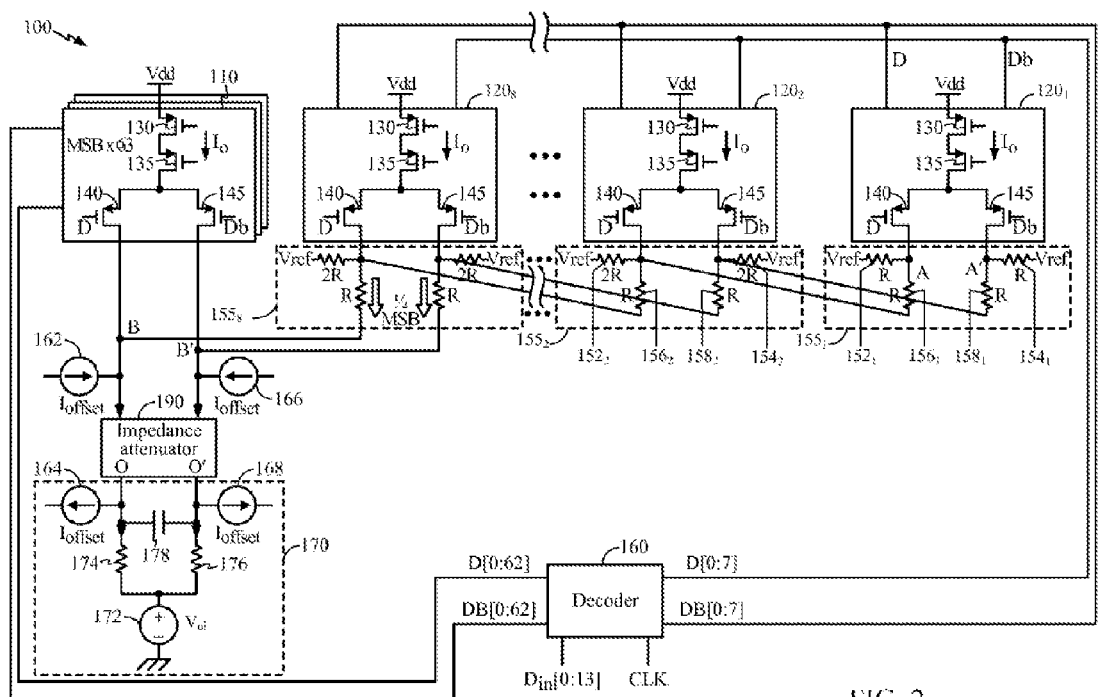
FIG. 2 is a simplifie block diagram of a current steering DAC adapted to have a low glitch noise, in accordance with one exemplary embodiment of the present invention.

FIG. 2 is a block diagram of a 14-bit current steering DAC 100 adapted to have a low glitch noise, in accordance with one exemplary embodiment of the present invention. DAC 100 may be used in device 150 shown in FIG. 1. Although DAC 100 is shown as having a 14-bit resolution, it is understood that a low glitch noise DAC, in accordance with the present invention, may have a higher or lower resolution that 14-bit. DAC 100 includes 63 similar input stages $110_j$—j is an integer varying from 1 to 63—that are connected in parallel (for simplicity only one of the stages 110 is shown) to form the 6 most significant bits (MSBs) of the DAC. DAC 100 also includes 8 stages $120_i$—i is an integer varying from 1 to 8—that form the 8 least significant bits (LSBs) of the DAC. The 63 input stages $110_j$ are alternatively and collectively referred to as input stage 110. Likewise, the 8 input stages $120_i$ are alternatively and collectively referred to as input stage 120. For simplicity, only three of input stages $120_i$ are shown.

DAC 100 is also shown as including an output stage 190, described in detail below. DAC 100 is also shown as including a decoder 160 that receives a 14-bit input signal $D_{in}[13:0]$ and decodes the various true D and complement bits DB that are applied to transistors 140, 145 of the various input stages 110, 120.

Each input stage $120_i$ is shown as including a pair of transistors 130 and 135 that together form a cascode current source. Each input stage $120_i$ is also shown as including a pair of transistor switches 140 and 145 that are responsive to a pair of differential data D and DB associated with and received by the input stage. Each input stage $110_j$ is also shown as including a pair of transistors 130 and 135 that together form a cascode current source. Each input stage $110_j$ is also shown as including a pair of transistor switches 140 and 145 that are responsive to a pair of differential data D and $D_B$ associated with and received by that input stage. Transistors 130 disposed in input stages $120_i$ and 110 have substantially the same size. Similarly, transistors 135 disposed in input stages $120_i$ and $110_j$ have substantially the same size. Accordingly, currents $I_O$ generated in stages $120_i$ and $110_j$ have the same magnitude.

DAC 100 is also shown as including 8 resistive networks $155_i$ each associated with a different one of the 8 LSB stages 120. Each resistive networks $155_i$ is associated with an input stage $120_i$ and is adapted to scale the current the resistive network receives from its associated input stage. The resistive network associated with each input stage forms an R-2R network when viewed from the drain terminals of the transistor switches 140, 145 disposed in that input stage. For example, stage $120_2$ is shown as including R-2R resistive network $155_2$. Likewise, stage $120_8$ is shown as including R-2R resistive network $155_8$.

As is seen from FIG. 2, each resistive network $155_i$ is shown as including 4 resistors, namely resistors $152_i$, $154_i$, $156_i$, and $158_i$. Resistors $152_i$ and $156_i$ of each input stage $120_i$ have a common terminal coupled to the drain terminal of transistor switch $140_i$ disposed in that input stage. Similarly, resistors $154_i$ and $158_i$ of each input stage $120_i$ have a common terminal coupled to the drain terminal of transistor switch $145_i$ disposed in that input stage. The second terminals of resistors $152_i$ and $154_i$ receive reference voltage $V_{ref}$. For each stage $120_k$, where k is integer ranging from 1 to 7, the second terminal of resistor $156_k$ is coupled to the drain terminal of transistor switch $140_{k+1}$, i.e. the transistor switch receiving the true input data $D_{k+1}$ and disposed in input stage $120_{k+1}$ having a bit position that is one higher than the bit position of input stage $120_k$. Likewise, the second terminal of resistor $158_k$ is coupled to the drain terminal of transistor switch $145_{k+1}$, i.e. the transistor switch receiving the complementary input data $DB_{k+1}$ and disposed in input stage $120_{k+1}$.

For example, resistive network $155_2$ associated with input stage $120_2$ is shown as including resistors $152_2$, $154_2$, $156_2$, and $158_2$. Resistors $152_2$ and $156_2$ have a common terminal coupled to the drain terminal of transistor switch $140_2$ disposed in input stage $120_2$. Similarly, resistors $154_2$ and $158_2$ of input stage $120_2$ have a common terminal coupled to the drain terminal of transistor switch $145_2$ disposed in input stage $120_2$. The second terminals of resistors $152_2$ and $154_2$ receive reference voltage $V_{ref}$. The second terminal of resistor $156_2$ is coupled to the drain terminal of transistor switch $140_3$. Likewise, the second terminal of resistor $158_2$ is coupled to the drain terminal of transistor switch $145_3$.

Resistors $152_8$ and $156_8$ of resistive network $155_8$, associated with the last LSB stage, have a common terminal coupled to the drain terminal of transistor switch $140_8$ disposed in input stage $120_8$. Similarly, resistors $154_8$ and $158_8$ of each input stage $120_8$ have a common terminal coupled to the drain terminal of transistor switch $145_8$ disposed in input stage $120_8$. The second terminals of resistors $152_8$ and $154_8$ receive reference voltage $V_{ref}$. The second terminal of resistor $156_8$ is coupled to summing node B of output stage 190. Likewise, the second terminal of resistor $158_8$ is coupled to summing node B' of output stage 190.

Each of resistors $156_i$ and $158_i$ has a resistance R. Resistors $152_1$ and $154_1$ also have a resistance of R. Each of resistors $152_i$ and $154_i$ of the remaining 7 stages has a resistance of 2R. Accordingly, the resistive network $155_i$ associated with each input stage $120_i$ forms an R-2R network when viewed from the drain terminals of transistor switches $140_i$ and $145_i$ disposed in that input stage.

The resistances in each resistive network $155_i$ are selected such that the current flowing through each resistive network is proportional to the binary weight of the resistive network's associated input stage $120_i$. Accordingly, if the current flowing through cascode transistors 130 and 135 of each input stage is assumed to be $I_0$, the current flowing through, for example, resistors $156_8$ and $158_8$ disposed in resistive network $155_8$ of stage $120_8$—associated with the $7^{th}$ most significant bit—into summing node B, B' is $(½)*I_0$. Likewise, the current flowing through resistive network $155_1$ of stage $120_1$—associated with the least significant bit—into summing nodes B, B' is $(1/256)*I_0$. The currents flowing through the resistive networks $150_i$ are delivered to current summing nodes B, B', which provide input signals to output stage 190. In the exemplary embodiment of DAC 100, the resistive networks are shown as being R-2R networks, however, it is understood that any other resistive network adapted to scale the current using a binary weight may be used.

Output stage 190, in accordance with one aspect of the present invention, includes an impedance attenuator 190. Output stage 190 is alternatively referred to herein as impedance attenuator 190. The differential voltage across output nodes O, O' of impedance attenuator 190 represents the output voltage of DAC 100. Resistors 174, 176, together with capacitor 178 and voltage source 172 represent an output load 170. Current sources 162, 164 provide current $I_{offset}$ to nodes B, B' respectively, and current sinks 166 and 168 withdraw current $I_{offset}$ from node O, O' respectively. Current sources 162, 164, and current sinks 166, 168 are adapted to maintain the transistors disposed in attenuator 190 biased in the active regions of operation.

Because the currents flowing through the transistor switches 140 and 145 in all input stages 110, 120 of the DAC are substantially the same and are scaled—after passing through the transistor switches—only by their associated resistive networks, and further because the switches 140 and 145 in all stages have the same size, the glitch energy between the MSB and LSB stages of DAC 100 are matched. DAC 100 thus has a substantially lower glitch noise than conventional DACs. The resistive networks accurately divide the currents that pass through the switches using binary weights. Resistor matching of 8-bit accuracy for the exemplary 14-bit DAC 106 is relatively easily attainable.

Because of the R-2R network seen by each input stage $120_k$, one-half of the current flowing through transistor $140_i$ of each input stage $120_i$ is supplied to voltage $V_{ref}$, while the other half of this current is supplied to the drain terminal of transistor $140_{(i+1)}$. Likewise, one-half of the current flowing through transistor $145_i$ of each input stage $120_i$ is supplied to voltage $V_{ref}$, while the other half of this current is supplied to the drain terminal of transistor $145_{(i+1)}$. Therefore, the current flowing through each resistive network $155_i$ is one-half the current flowing through resistive network $155_{(i+1)}$. Accordingly, the current flowing through the resistive network in each input stage $120_i$ is proportional to the binary weight of the resistive network's associated input stage $120_i$ in the DAC.

Impedance attenuator 190 advantageously increases the range of impedances that output load 170 may have. Impedance attenuator 190 is further adapted to account for changes in the output load impedance due to variations in the process, voltage and temperature. Consequently, since all the input stages of DAC 100 generate the same amount of current and have similar switch sizes, DAC 100 has a much smaller out-of-band noise variation across process, voltage and temperature than conventional DACs. Furthermore, impedance attenuator 190, in accordance with the present invention, provides more flexibility in selecting the resistances of resistors $152_i$, $154_i$, $156_i$ and $158_i$ to ensure that SFDR and SNDR of DAC 100 fall within desired values. In other words, the impedance attenuator, in accordance with the present invention, decouples the resistances of the resistive networks from the load resistance.

Figure 3:
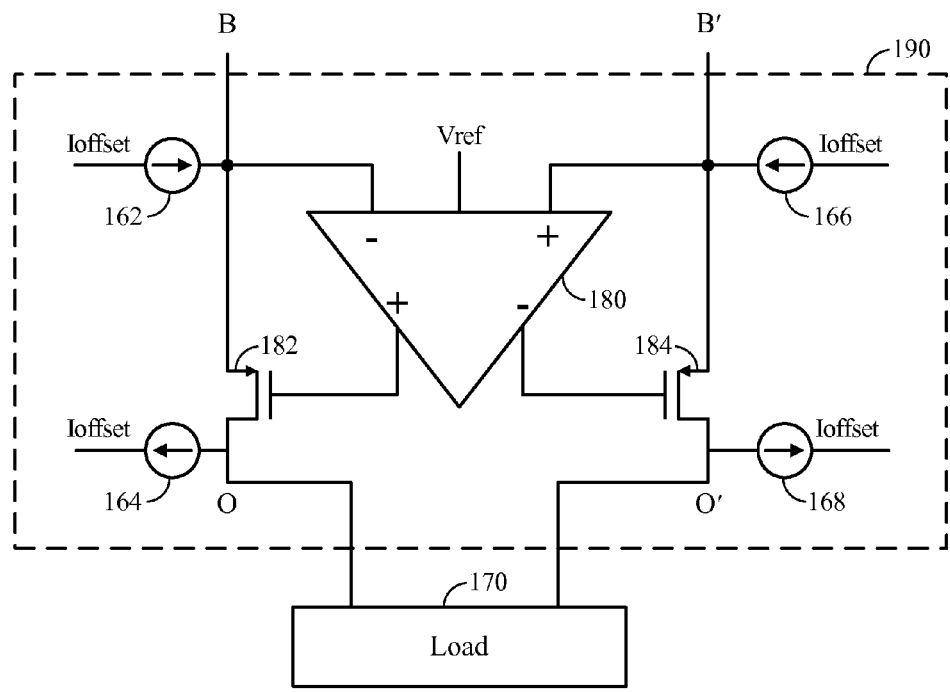
FIG. 3 is a simplified block diagram of the impedance attenuator of the DAC shown in FIG. 2, in accordance with one exemplary embodiment of the present invention.

FIG. 3 is a simplified block diagram of impedance attenuator 190 coupled to load 170. Impedance attenuator 190 is shown as including an amplifier 180 having a pair of differential inputs and a pair of differential outputs, and transistors 182, 184. Impedance attenuator is described in U.S. Pat. No. 8,169,353. Current sources 162, 164 provide current $I_{offset}$ to nodes B, B' respectively, and current sinks 166 and 168 withdraw current $I_{offset}$ from node O, O' respectively. Current sources 162, 164, and current sinks 166, 168 are adapted to maintain transistors 182, 184 in the active region of operation.

Attenuator 190 is adapted to maintain the voltage difference between nodes B, B' within a relatively small range defined by the DC gain of amplifier 180. For example, if amplifier 180 has a DC gain of 60 dB, and the voltage difference between output nodes O, O' is 1V, the voltage difference between nodes B, B' is maintained at nearly 1 mv, as described further below.

Assume, for example, that DAC 100 steers more current to node B in response to a change at the input of the DAC. This causes the voltage at node B to increase. Because the input terminals of amplifier 180 have a relatively high impedance, the extra current injected into node B is cause to flow through transistor 182, thereby causing the voltage at output node O to increase. Amplifier 180 is adapted to decrease the gate voltage of PMOS transistor 182 so as to maintain the source voltage of PMOS transistor 182 relatively constant. By maintaining the source voltage of transistors 182 relatively constant, the voltage difference between nodes B, B' is maintained within a very narrow range defined by the DC gain of amplifier 180. The ratio of impedance of nodes B, B' to the impedance of nodes O, O' is also defined by the gain of amplifier 180. Although impedance attenuator 190 of FIG. 3 is shown as including a fully differential amplifier 180, it is understood that in other embodiments, impedance attenuator 190 may include a pair of single-ended amplifiers instead, as shown in U.S. Pat. No. 8,169,353.

Figure 4:
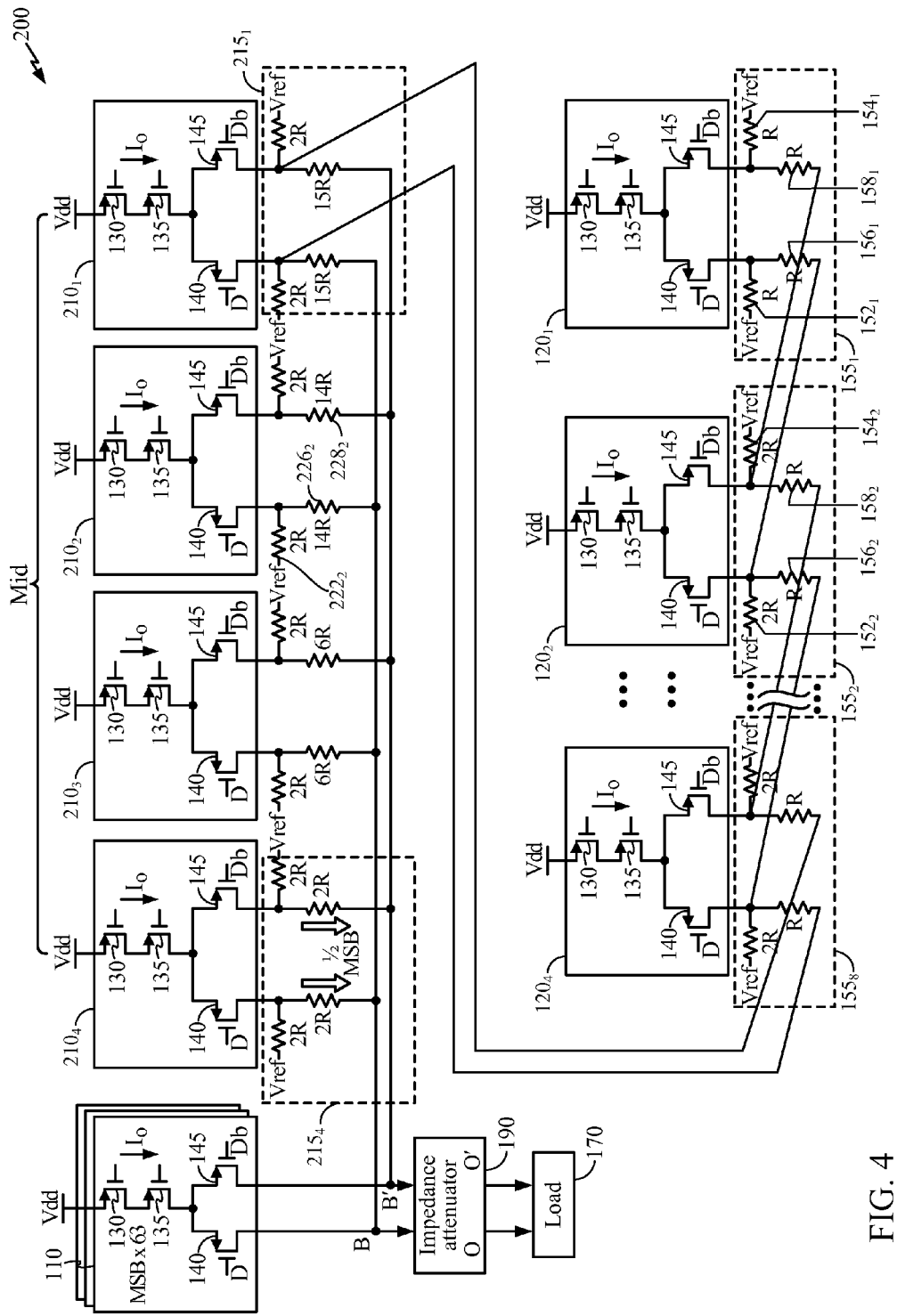
FIG. 4 is a simplified block diagram of a current steering DAC adapted to have a low glitch noise, in accordance with another exemplary embodiment of the present invention.

FIG. 4 is a simplified block diagram of a current steering DAC 200 adapted to have a low glitch noise, in accordance with another exemplary embodiment of the present invention. DAC 200 is a 14-bit DAC shown as including, in part, 63 similar stages $110_j$ that are connected in parallel (only one of the stage 110 is shown) to form the 6 MSBs of DAC 200. DAC 200 also includes 4 stages $210_1$, $220_2$, $220_3$, $220_4$ (alternatively and collectively referred to as stage 210) that form the 4 middle bits (MID) of DAC 200. DAC 200 also includes 4 stages $120_1$, $120_2$, $120_3$, $120_4$ (alternatively and collectively referred to as stage 120 or $120_i$) that form the 4 LSBs of the DAC. Although not shown, it is understood that DAC 200 also includes a decoder similar to the one shown in FIG. 2. DAC 200 also includes an impedance attenuator 190. Although DAC 200 is shown as being a 14-bit DAC, it is understood that a low glitch noise DAC, in accordance with the present invention, may have higher or fewer than 14 bits of resolution.

Transistors 130 disposed in input stages $120_i$, $110_j$ and $210_m$ (m is an integer varying from 1 to 4) have substantially the same size. Similarly, transistors 135 disposed in input stages $120_i$ and $110_j$ and $210_m$ have substantially the same size. Accordingly, currents $I_0$ generated in all stages $120_i$, $110_j$ and $210_m$ have the same magnitude.

Input stages $120_i$ of DAC 200 are similar to input stages $120_i$ of DAC 100 (see FIG. 2) as described above. Each MID stage $210_m$ of DAC 200 includes a resistive network $215_m$ that scales the current the resistive network receives from the switches disposed in its associated stage in accordance with the binary weight assigned to that stage. For example, stage $210_4$ is shown as including a resistive network $215_4$ that scales the current it receives from its associated switches $140_4$ and $145_4$ to ($\frac{1}{2} \times I_0$) and delivers this current to summing nodes B, B' of DAC 200. The resistances in each resistive network associated with input stage $210_m$ are selected such that the current flowing through each such resistive network is proportional to the binary weight of the resistive network's associated input stage in the DAC.

Each resistive networks $215_m$ is shown as including 4 resistors. Resistors $222_m$ and $226_m$ of resistive network $215_m$ have a common terminal coupled to the drain terminal of transistor switch $140_m$ disposed in input stage $210_m$. Similarly, resistors $224_8$ and $228_8$ of each input stage $215_m$ have a common terminal coupled to the drain terminal of transistor switch $145_m$ disposed in input stage $210_m$. The second terminals of resistors $222_m$ and $224_m$ receive reference voltage $V_{ref}$. The second terminal of resistor $226_m$ is coupled to summing node B of impedance attenuator 190. Likewise, the second terminal of resistor $228_m$ is coupled to summing node B' of output impedance attenuator 190.

Each of the four resistors $222_4$, $224_4$, $226_4$ and $228_4$ in resistive network $215_4$ has a resistance of 2R. Accordingly, half of the current I° passing through transistors $140$, $145$ of input stage $210_4$ is caused to flow to voltage $V_{ref}$, while the other half of this current is caused to flow to the summing nodes B, B'. Resistors $222_3$, $224_3$ of resistive network $215_3$ are shown as having a resistance of 2R, and resistors $226_3$ and $228_3$ of resistive network $215_3$ are shown as having a resistance of 6R. Accordingly, ¾ (i.e., 6/(6+2)) of current $I_o$ flowing through transistors $140_3$, $145_3$ of input stage $210_3$ is caused to flow to voltage $V_{ref}$, and ¼ (i.e., 2/(6+2)) of current $I_o$ flowing through transistors $140_3$, $145_3$ of input stage $210_3$ is caused to flow to the summing nodes B, B'. Resistors $222_2$, $224_2$ of resistive network $215_2$ are shown as having a resistance of 2R, and resistors $226_2$ and $228_2$ of resistive network $215_2$ are shown as having a resistance of 14R. Accordingly, ⅞ (i.e., 14/(14+2)) of current $I_o$ flowing through transistors $140_2$, $145_2$ of input stage $210_2$ is caused to flow to voltage $V_{ref}$, and ⅛ (i.e., 2/(14+2)) of current $I_o$ flowing through transistors $140_1$, $145_2$ of input stage $210_2$ is caused to flow to the summing nodes B, B'. Resistors $222_1$, $224_1$ of resistive network $215_1$ are shown as having a resistance of 2R, and resistors $226_1$ and $228_1$ of resistive network $215_1$ are shown as having a resistance of 15R. However, as is seen from FIG. 4, resistors $222_1$ and $224_1$ of input stage $210_1$ are also connected to resistive network $155_4$ of the LSB stage $120_4$. Accordingly, the effective resistance between the common terminal of resistors $222_1$, $226_1$ and Vref is R. Likewise, the effective resistance between the common terminal of resistors $224_1$, $228_1$ and Vref is R. Accordingly, 15/16 (i.e., 15/(15+1)) of current $I_o$ flowing through transistors $140_1$, $145_1$ of input stage $210_1$ is caused to flow to voltage $V_{ref}$, and 1/16 (i.e., 1/(15+1)) of current $I_o$ flowing through transistors $140_1$, $145_1$ of input stage $210_1$ is caused to flow to summing nodes B, B'. In other words, In spite of not being R-2R networks, the resistive network associated with each of stages $222_4$, $224_4$, $226_4$ and $228_4$ provides a current to the summing nodes B, B' in proportion to the binary weight of that stage in the DAC.

Each LSB stage $120_i$ includes a resistive network that scales the current passing through it in accordance with the binary weight assigned to its associated input stage. The current scaled by each resistive network is delivered to the resistive network of the immediately preceding stage whose bit position is higher by 1 bit. For example, the current scaled by resistive network $155_4$ is delivered to resistive network $215_1$ associated with MID stage $210_1$; the current scaled by resistive network $155_3$ is delivered to resistive network $155_4$; the current scaled by resistive network $155_2$ is delivered to resistive network $155_3$; and the current scaled by resistive network $155_1$ is delivered to resistive network $155_2$ in a chain like fashion, and as shown in FIG. 4.

Figure 5:
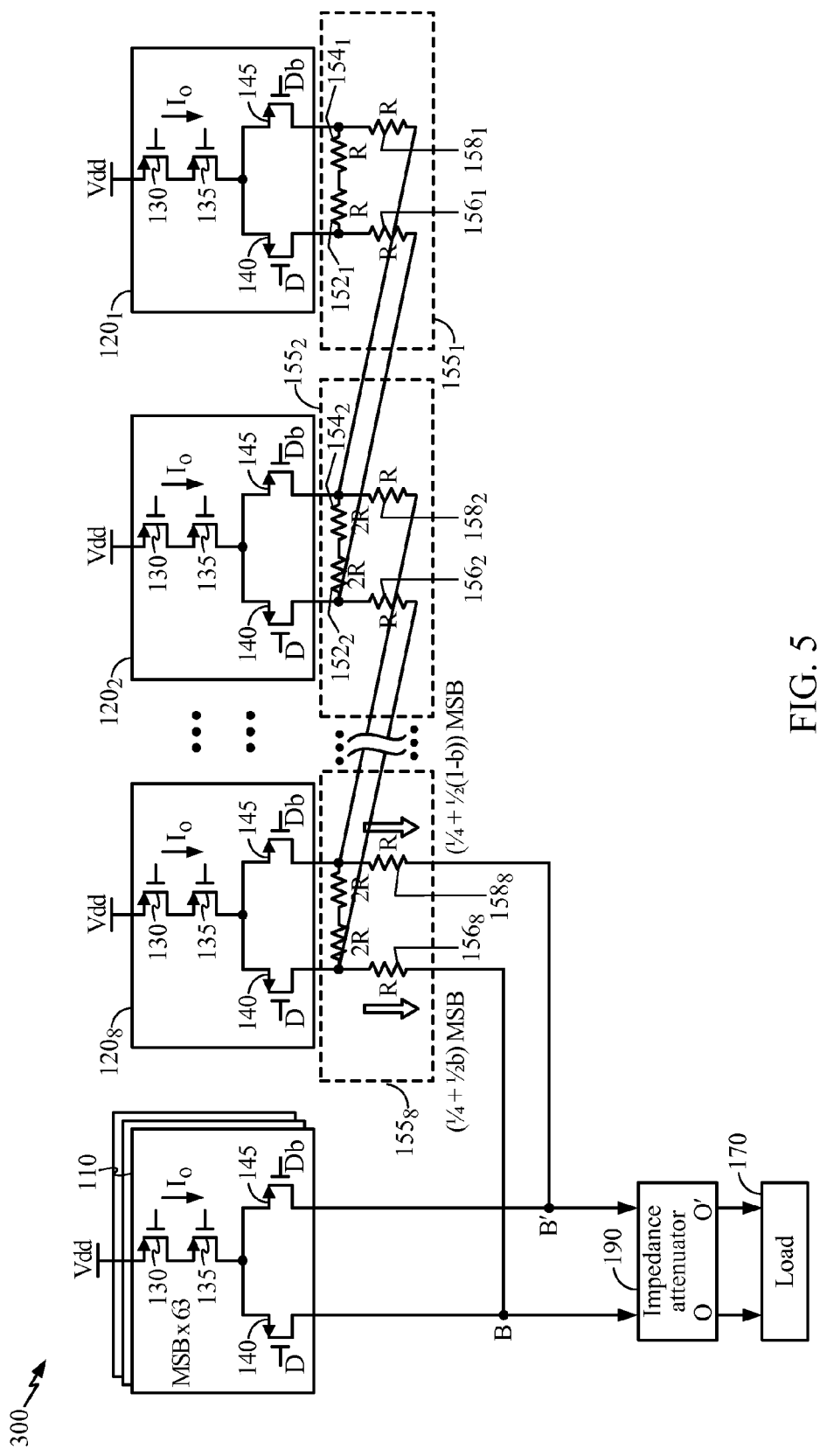
FIG. 5 is a simplified block diagram of a current-steering DAC adapted to have a low glitch noise, in accordance with another exemplary embodiment of the present invention.

FIG. 5 is a simplified block diagram of a current-steering 14-bit DAC 300 adapted to have a low glitch noise, in accordance with another exemplary embodiment of the present invention. Although not shown, it is understood that DAC 300 also includes a decoder similar to the one shown in FIG. 2. It is also understood that DAC 300 may have a higher or lower than 14 bits of resolution.

DAC 300 is shown as including 63 similar stages 110 that are connected in parallel to form the 6 MSBs of the DAC. DAC 300 further includes 8 stages $120_i$ that form the 8 LSBs of the DAC in a manner similar to DAC 100 of FIG. 2. DAC 300 dispenses the need for the reference voltage Vref and is a differential DAC. As shown in FIG. 5, resistors $152_i$ and $154_i$ in each of the resistive networks $155_i$ are coupled to one another instead of being coupled to voltage source $V_{ref}$ (see FIG. 2). Each of resistors $152_i$, $154_i$ is shown as having a resistance of 2R. Each of resistors $152_i$, $154_i$ is shown as having a resistance of R.

As is seen from FIG. 5, for example, the currents flowing through resistors $156_8$ and $158_8$ of resistive network $155_8$ are respectively shown as being equal to $[(¼+½*b)*I_o]$ and $[(¼+½*(1-b))*I_o]$, where b is the binary value of bit 8 of the 14-bit DAC 300. As is also seen from FIG. 5, other than stage $120_8$, the current generated in each of the other stages $120_i$ is scaled by the stage's associated resistive network and delivered to the resistive network of an immediately preceding stage whose bit position is one higher than the bit position of the stage from which it receives the current, as was also described in connection with DAC 100 of FIG. 2. For example, the current scaled by resistive network $155_1$ of stage $120_1$ is delivered to resistive network $155_2$ of stage $120_2$.

Since the amplifier disposed in the impedance attenuator 190 of any of DACs 100, 200, or 300 has a limited gain-bandwidth product, the voltage of nodes B, B' may vary when the DAC output current varies. Referring to FIG. 3, since the gate-to-source capacitances of PMOS transistors 182, 184 is relatively large, nonlinear current variations at the output nodes of the impedance attenuator, i.e., gate terminals of transistors 182, 184, may get coupled to the input nodes of the impedance attenuator B, B', thereby causing the currents at nodes B, B' to vary nonlinearly. Such nonlinear currents may then flow through the resistive networks into voltage source $V_{ref}$. Since the resistance R of the resistive networks may be smaller than the impedance of the parasitic capacitances of the DAC transistors, such current flow may degrade the SFDR of the DAC. The lower the resistance R, the larger is the degradation.

Figure 6:
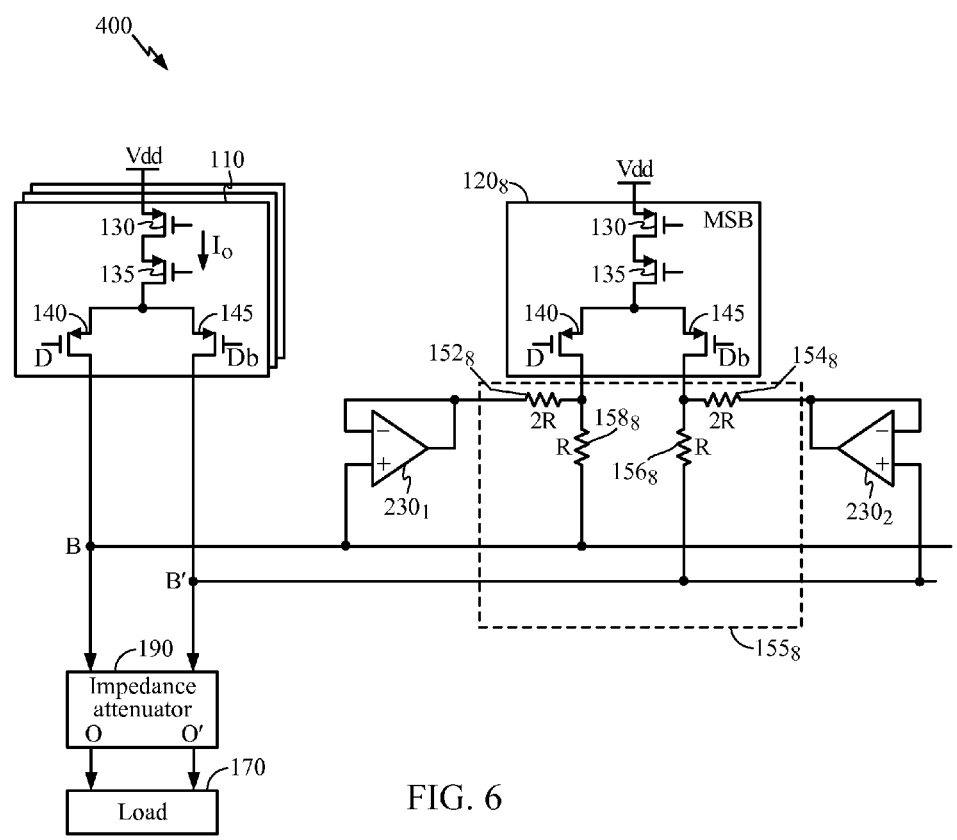
FIG. 6 is a simplified block diagram of a segment of a current-steering DAC, in accordance with another exemplary embodiment of the present invention.

To minimize the SFDR degradation due to nonlinear current flow from/to the input nodes of the impedance attenuator, in accordance with one embodiment of the present invention, the resistor voltages are tracked. FIG. 6 is a simplified block diagram of a segment of a DAC 400, in accordance with one embodiment of the present invention. DAC 400 may be, for example, a segment of DAC 100 shown in FIG. 2. Only one of the MSB stages $110_1$ and one of the LSB stages $120_8$ of the DAC is shown in FIG. 6 but it is understood that DAC 400 has many more input stages. The resistive network in input stage $120_8$ is adapted to include a pair of amplifiers $230_1$ and $230_2$. The negative input terminal of amplifier $230_1$ is coupled to the amplifier's output terminal and to one of the terminals of resistor $152_8$, as shown. The positive input terminal of amplifier $230_1$ is coupled to node B. Likewise, the negative input terminal of amplifier $230_2$ is coupled to the amplifier's output terminal and to one of the terminals of resistor $154_8$, as shown. The positive input terminal of amplifier $230_2$ is coupled to node B'. Due to the existence of virtual ground between the two input terminals of each of the two amplifiers, the output voltage of amplifier $230_1$ tracks the voltage at node B, and the output voltage of amplifier $230_2$ tracks the voltage at node B', thereby minimizing SFDR degradation. In other words, because the variations in the voltage at node B is reflected at the terminal of resistor $152_8$, and the variations in the voltage at node B' is reflected at the terminal of resistor $154_8$, such voltage variations do not cause current flow from nodes B and B' to Vref, or vice versa, through the resistors—thus inhibiting SFDR degradation. Although not shown in FIG. 6, it is understood that each of the other stages $120_i$ of DAC 300 will share the same tracking circuit.

Figure 7:
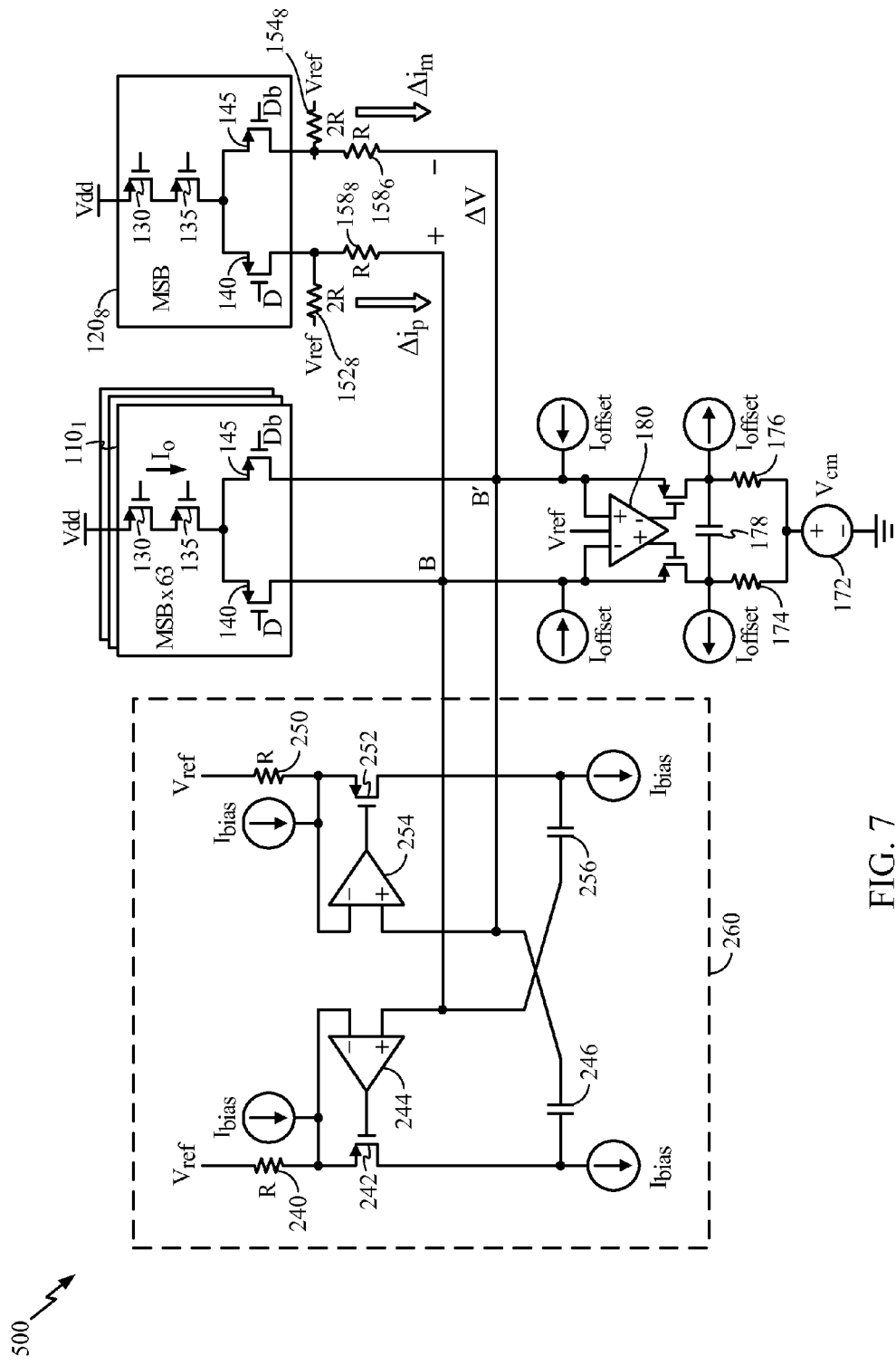
FIG. 7 is a simplified block diagram of a segment of a current-steering DAC, in accordance with another exemplary of the present invention.

FIG. 7 is a simplified block diagram of a segment of a DAC 500, in accordance with one embodiment of the present invention. DAC 500 may be, for example, a segment of DAC 100 shown in FIG. 2. Only one of the MSB stages $110_1$ and one of the LSB stages $120_8$ of the DAC is shown in FIG. 7 but it is understood that DAC 500 has many more input stages. DAC 500 has disposed therein a distortion cancellation circuit 260 that includes resistors 240, 250, transistors 242, 252, amplifiers 244, 254 and capacitors 244, 156.

Distortion cancellation circuit 260 is adapted to oppose and cancel current flow between supply voltage $V_{ref}$ and nodes B, B', as described further below. Any decrease in voltage $V_p$ at node B (i.e., at the positive terminal of amplifier 244) decreases the voltage at the negative terminal of amplifier 244 (source terminal of PMOS 242) due to the presence of virtual ground between the input terminals of amplifier 244, thereby causing an increase in the current flow through transistor 242. This current increase which is AC coupled to node B' via capacitor 246 flows into node B', thereby canceling the differential current flow from $V_{ref}$ to node B through resistors $152_8$ and $158_8$. Similarly, any increase in voltage $V_p$ at node B increases the voltage at the negative terminal of amplifier 244, thereby causing a decrease in the current flow through transistor 242. This current decrease which is AC coupled to node B' via capacitor 246 flows from node B', thereby canceling the differential current flow from $V_{ref}$ to node B through resistors $152_8$ and $158_8$. Any increase/decrease in voltage at the source terminal of transistor 242 also causes a current flow to/from $V_{ref}$ via resistor 240. Likewise, any increase/decrease in voltage at the source terminal of transistor 252 causes a current flow to/from $V_{ref}$ via resistor 250.

Figure 8:
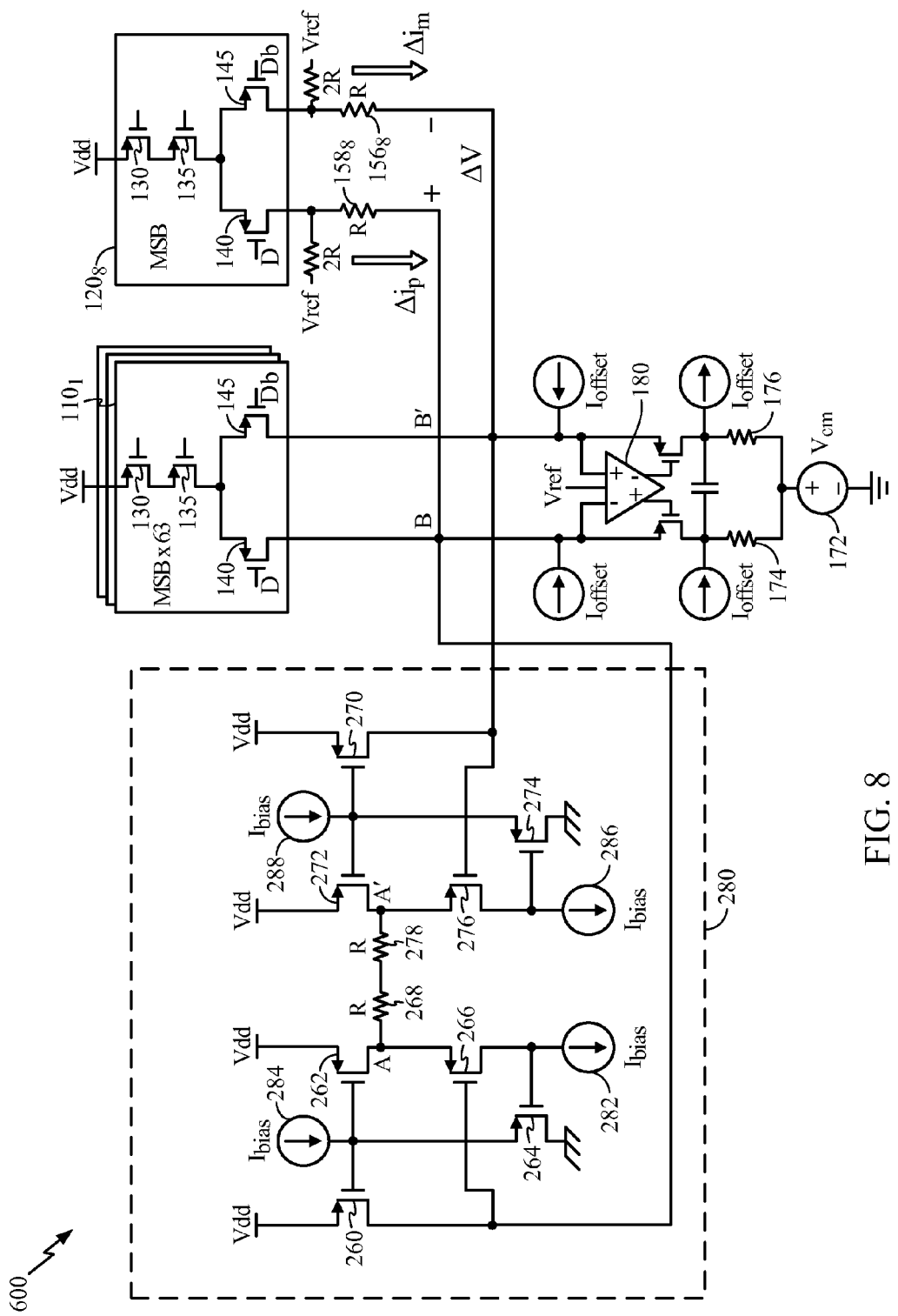
FIG. 8 is a simplified block diagram of a segment of a current-steering DAC, in accordance with another exemplary embodiment of the present invention.

FIG. 8 is a simplified block diagram of a segment of a DAC 600, in accordance with one embodiment of the present invention. DAC 600 may be, for example, a segment of DAC 100 shown in FIG. 2. Only one of the MSB stages $110_1$ and one of the LSB stages $120_8$ of the DAC is shown in FIG. 8 but it is understood that DAC 600 has many more input stages. DAC 600 has disposed therein a distortion cancellation circuit 280 that includes transistors 260, 262, 264, 266, 270, 272, 274, 276, resistors 268, 278, and current sources 282, 284, 286, and 288.

Transistors 266 and 276 that receive voltages $V_p$ and $V_m$ from nodes B, B' at their gates respectively, form the input stage to distortion cancellation circuit 280. Because the current though transistors 266 and 276 are set by current sources 282 and 286 respectively, if voltage $V_p$ increases and voltage Vm remains unchanged, the source voltage of transistor 266 at node A also increases to maintain the gate-to-source voltage of transistor 266 nearly constant. The voltage at node A' remains unchanged. Therefore, current flows from node A to node A'. The current flowing from node A to node A' is generated by transistor 262. To accommodate this extra current, the gate voltage of transistor 262 is decreased, in turn, resulting in a similar increase in the current flow through transistor 260. The increased current through transistor 260, which forms a current mirror with transistor 262, increases voltage $V_p$ even further. However, because the impedance of node B is maintained at a relatively low value by the impedance attenuator, voltage $V_p$ increases only slightly. For example, assume Vp=1.0002, Vm=999.8 mV, the load impedance is 1 k-ohm, and the impedance attenuator attenuates the impedance of the load by 1 ohm. This causes the current injected to be about 400 nA, thus increasing the voltage Vp by 200 nV (400 nA/2*1 ohm). Therefore, the loop gain is much smaller than unity. Distortion cancellation circuit 280 thus operates using positive feedback circuitry. The relatively small input impedances at nodes B, B' ensure that the gain of this feedback loop is smaller than unity to provide stability and prevent oscillation.

The current flow from node A to node A' also causes the current though transistor 272 to decrease. Since transistor 270 and 272 also form a current mirror, the decrease in current though transistor 272 causes a similar decrease in the current though transistor 270, thereby causing a decrease in voltage $V_m$. But as was described above, because node B' has a relatively low impedance, the decrease in voltage $V_m$ is relatively small.

Transistor 264 is configured as a source-follower amplifier. Therefore, changes in the gate voltage of transistor 264 is reflected in corresponding voltage changes at the source of transistor 264. Current source 284 is adapted to flow through transistor 264. Transistor 274 is also configured as a source-follower amplifier. Therefore, changes in the gate voltage of transistor 274 is reflected in corresponding voltage changes at the source of transistor 274. Current source 288 is adapted to flow through transistor 274. Cancellation circuit 280 is well known and described in IEEE, International Solid-State Circuits Conferences, 1193, session 7, Analog Techniques, paper TA 7.2, pages 112-114. Although the distortion cancellation circuit is described with reference to FIG. 8, it is understood that any other distortion cancellation circuit which performs similar constant voltage-to-current conversion may be used.

As is known, the glitch noise and thus the glitch energy increases as the frequency of operation of a DAC increases. Referring, for example, to FIG. 2, as the frequency of operation increases, some of the glitch energy flows to the ground via the drain-to-substrate parasitic capacitors of transistors 140, 145 or parasitic capacitance of the wiring. The glitch energy that flows to the ground is generally less for the MSBs than the LSBs. The imbalance in the glitch energy that flows from different input stages of the DAC to the ground, may create an imbalance that can further increase the glitch noise.

Figure 9:
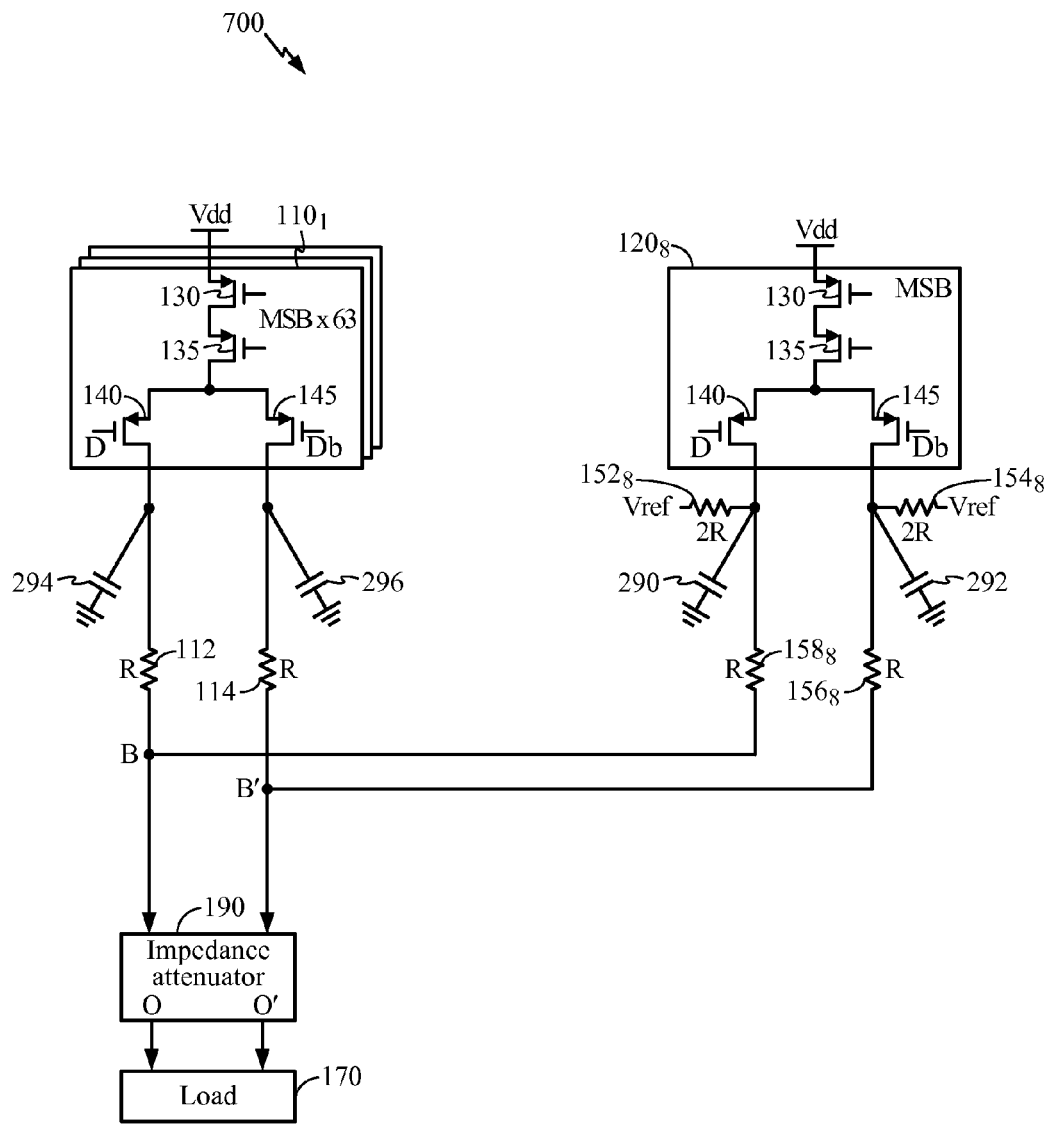
FIG. 9 is a simplified block diagram of a segment of a current-steering DAC, in accordance with another exemplary embodiment of the present invention.

FIG. 9 is a simplified block diagram of a segment of a DAC 700, in accordance with one embodiment of the present invention. DAC 700 may be, for example, a segment of DAC 100 shown in FIG. 2. Only one of the MSB stages $110_1$ and one of the LSB stages $120_8$ of DAC 700 is shown in FIG. 9 but it is understood that DAC 700 has many more input stages. FIG. 9 also shows the parasitic capacitances 290, 292 present between the drain terminals of transistors 140, 145 of input stage $120_8$ and ground, as well as parasitic capacitances 294, 296 present between the drain terminals of transistors 140, 145 of input stage $110_1$ and ground.

To minimize the glitch noise caused by the imbalance in the glitch energy that flows from input stages $120_8$, $110_1$ to the ground, in accordance with one embodiment of the present invention, resistors 112, 114 are disposed between the drain terminals of transistors 140, 145 of MSB stage $110_1$ and summing nodes B, B' of DAC 700. Each of the resistor 112, and 114 has a resistance of R. Resistors 112, 114 cause the RC values seen at the drain terminals of transistors 140, 145 of input stage $120_8$ to match those seen by the drain terminals of transistors 140, 145 of input stage $110_8$ respectively. This RC matching inhibits the imbalance in glitch energy redistribution to ground and thus causes the glitch noise from input stage $110_1$ to match that from input stage $120_8$. It is understood that each of parallel stages 110 of DAC 700 may include resistors 112, 114.

Figure 10:
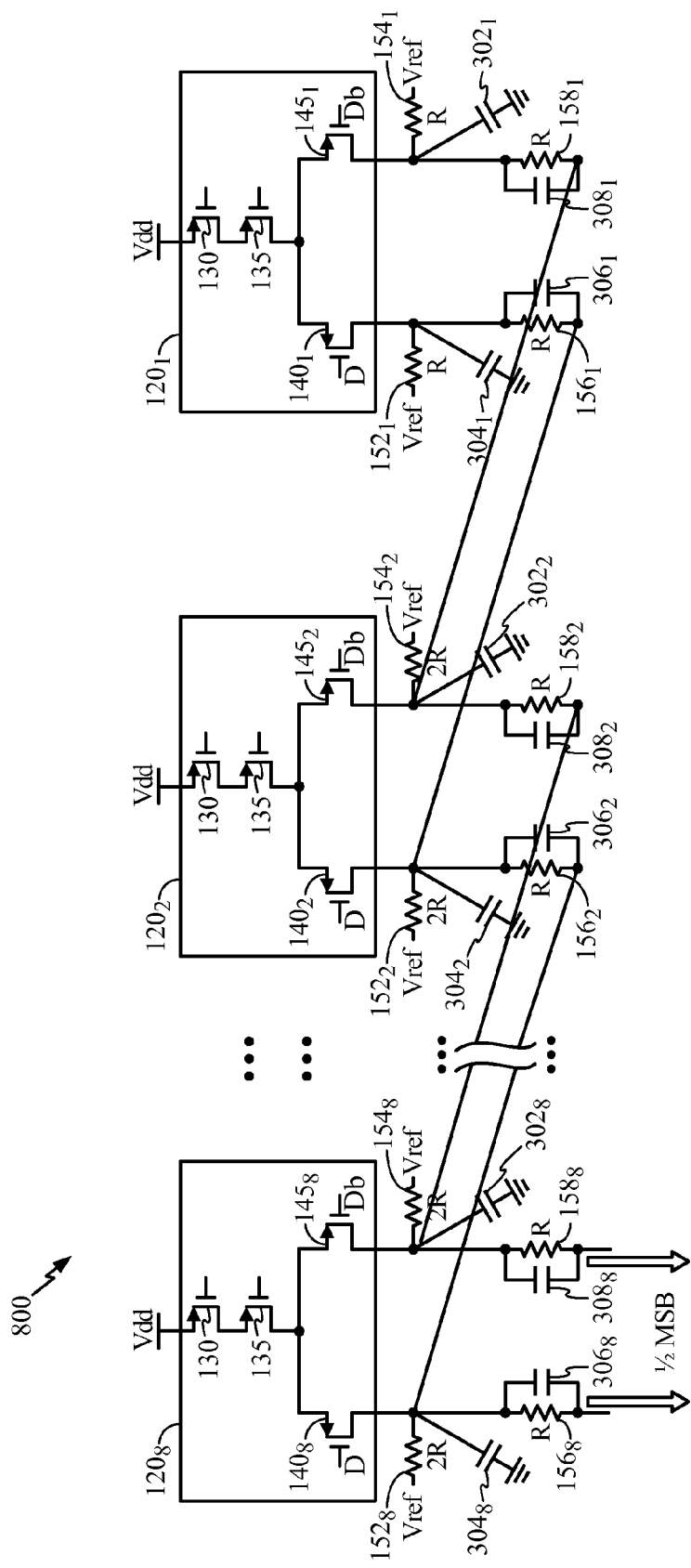
FIG. 10 is a simplified block diagram of a segment of a current-steering DAC, in accordance with another exemplary embodiment of the present invention.

FIG. 10 is a simplified block diagram of a segment of a DAC 800, in accordance with one embodiment of the present invention. DAC 800 may be, for example, a segment of DAC 100 shown in FIG. 2. Only three of the LSB stages $120_1$ and $120_2$ of DAC 800 are shown in FIG. 10 but it is understood that DAC 800 has many more input stages. FIG. 10 also shows the parasitic capacitances $302_1$, $304_1$ associated with transistors $140_1$, $145_1$ of input stage $120_1$, parasitic capacitances $302_2$, $304_2$ associated with transistors $140_2$, $145_2$ of input stage $120_2$, and parasitic capacitances $302_8$, $304_8$ associated with transistors $140_8$, $145_8$ of input stage $120_8$. To match the glitch noise between different input stages, each input stage of DAC 800 is adapted to include a pair of capacitors $306_i$, $308_i$ disposed in parallel between resistors $156_i$ and $158_i$ of that stage. For example, as shown, capacitors $306_1$, $308_1$ are disposed in parallel between resistors $156_1$ and $158_1$ of input stage $120_1$. Likewise, capacitors $306_8$, $308_8$ are disposed in parallel between resistors $156_8$ and $158_8$ of input stage $120_8$. Capacitors $306_i$, $308_i$ in each stage are adapted to feedforward the glitch energy so as to counter and cancel the glitch energy loss to the ground via parasitic capacitances $302_i$, $304_i$ of that stage. In one embodiment each of the capacitors $306_i$, $308_i$ is selected to have a capacitance twice the parasitic capacitance of capacitors $302_i$, $304_i$.

Figure 11:
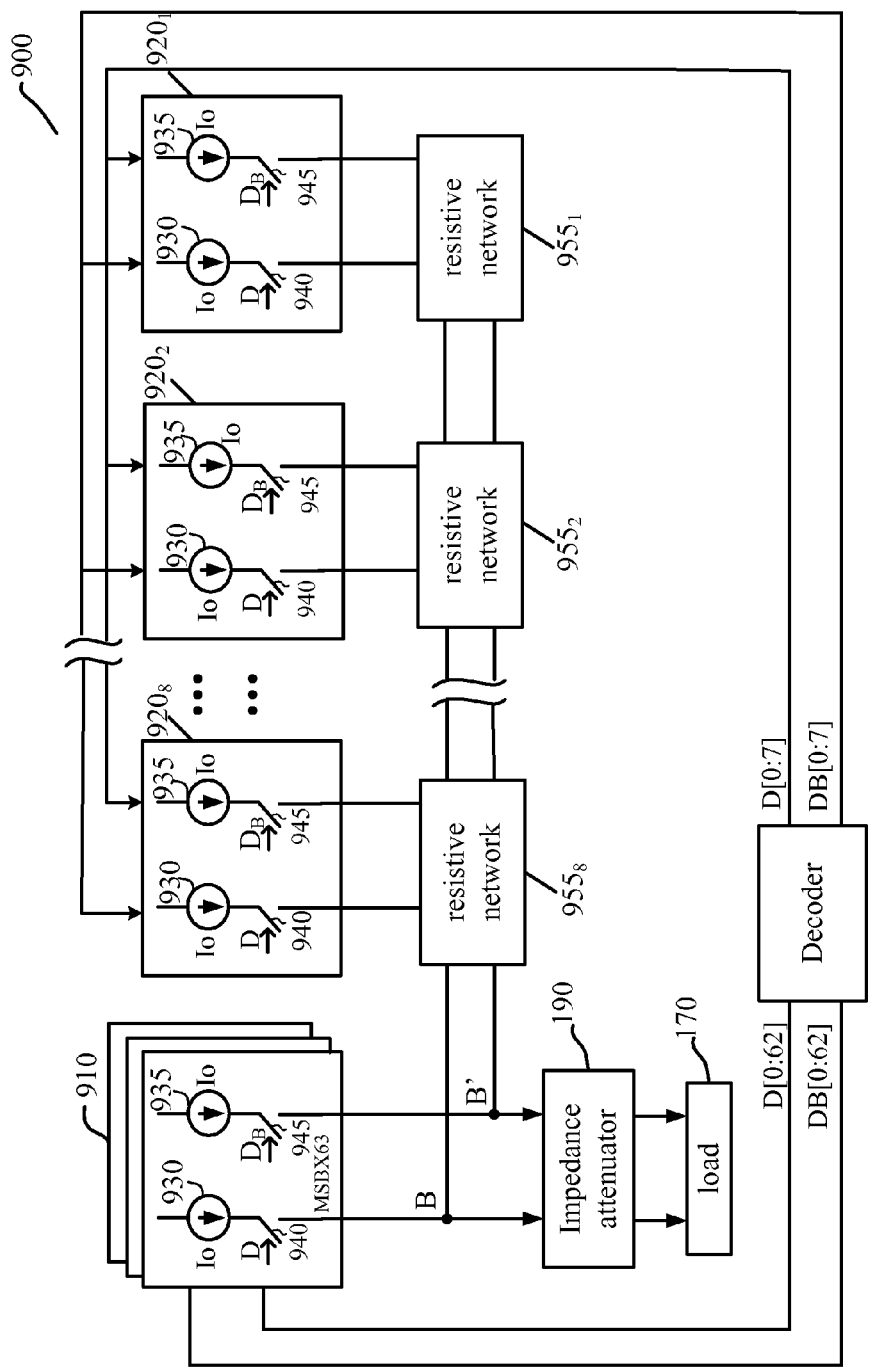
FIG. 11 is a simplifie block diagram of a current steering DAC adapted to have a low glitch noise, in accordance with another exemplary embodiment of the present invention.

FIG. 11 is a block diagram of a 14-bit current steering DAC 900 adapted to have a low glitch noise, in accordance with another exemplary embodiment of the present invention. DAC 900 may be used in device 150 shown in FIG. 1. Although DAC 900 is shown as having a 14-bit resolution, it is understood that a low glitch noise DAC, in accordance with the present invention, may have a higher or lower resolution that 14 bits. DAC 900 includes 63 similar input stages $910_j$—j is an integer varying from 1 to 63—that are connected in parallel (for simplicity only one of the stages 910 is shown) to form the 6 most significant bits (MSBs) of the DAC. DAC 900 also includes 8 stages $920_i$—i is an integer varying from 1 to 8—that form the 8 least significant bits (LSBs) of the DAC. The 63 input stages $910_j$ are alternatively and collectively referred to as input stage 910. Likewise, the 8 input stages $920_i$ are alternatively and collectively referred to as input stage 920. For simplicity, only three of input stages $920_i$ are shown.

DAC 900 is also shown as including an impedance attenuator 190, as described in detail below. DAC 900 is also shown as including a decoder 160 that receives a 14-bit input signal $D_{in}[13:0]$ and decodes the various true D and complement bits DB that are applied to switches 940, 945 of the various input stages 910, 920.

Each input stage $920_i$ is shown as including a pair of current source 930, 935. Each input stage $920_i$ is also shown as including a pair of switches 940 and 945 that are responsive to a pair of differential data D and DB associated with and received by the input stage, as well as to the currents supplied by current sources 930, 935. Currents $I_0$ generated by current source 930, 935 in stages $920_i$ and $910_j$ have substantially the same magnitude.

DAC 900 is also shown as including 8 resistive networks $955_i$ each associated with a different one of the 8 LSB stages 920. Each resistive network $955_i$ is associated with an input stage $920_i$ and is adapted to scale the current the resistive network receives from its associated input stage. In one embodiment, the resistive network associated with each input stage forms an R-2R network when viewed from switches 940, 945 disposed in that input stage.

As is seen from FIG. 11, the resistive network associated with each stage $920_k$, where k is integer ranging from 1 to 7, is coupled to the resistive network of input stage $920_{k+1}$ having a bit position that is one higher than the bit position of input stage $920_k$. For example, resistive network $955_2$ associated with input stage $920_2$ is shown as being coupled to resistive network $955_3$ associated with input stage $920_3$. The resistive network $955_8$ is coupled to summing nodes B, B' of impedance attenuator 190.

The current flowing through each resistive network is proportional to the binary weight of the resistive network's associated input stage $920_i$. Accordingly, if the current flowing through current sources 930 and 935 of each input stage is assumed to be $I_0$, the current flowing through, for example, resistive network $955_8$ of stage $920_8$—associated with the $7^{th}$ most significant bit—into summing node B, B' is $(1/2)*I_0$. Likewise, the current flowing through resistive network $955_1$ of stage $920_1$—associated with the least significant bit—into summing nodes B, B' is $(1/256)*I_0$. The currents flowing through the resistive networks $955_i$ are delivered to current summing nodes B, B', which provide input signals to attenuator 190. It is understood that any resistive network adapted to scale the current using a binary weight may be used.

Because the currents flowing through the switches 940 and 945 in all input stages 910, 920 of the DAC are substantially the same and are scaled (after passing through the transistor switches) only by their associated resistive networks, the glitch energy between the MSB and LSB stages of DAC 900 are matched. DAC 900 thus has a substantially lower glitch noise than conventional DACs. The resistive networks accurately divide the currents that pass through the switches using binary weights. Resistor matching of 8-bit accuracy for the exemplary 14-bit DAC 900 is relatively easily attainable.

Impedance attenuator 190 advantageously increases the range of impedances that output load 170 may have. Impedance attenuator 190 is further adapted to account for changes in the output load impedance due to variations in the process, voltage and temperature. Consequently, since all the input stages of DAC 900 generate the same amount of current and have similar switch sizes, DAC 900 has a much smaller out-of-band noise variation across process, voltage and temperature than conventional DACs.

Figure 12:
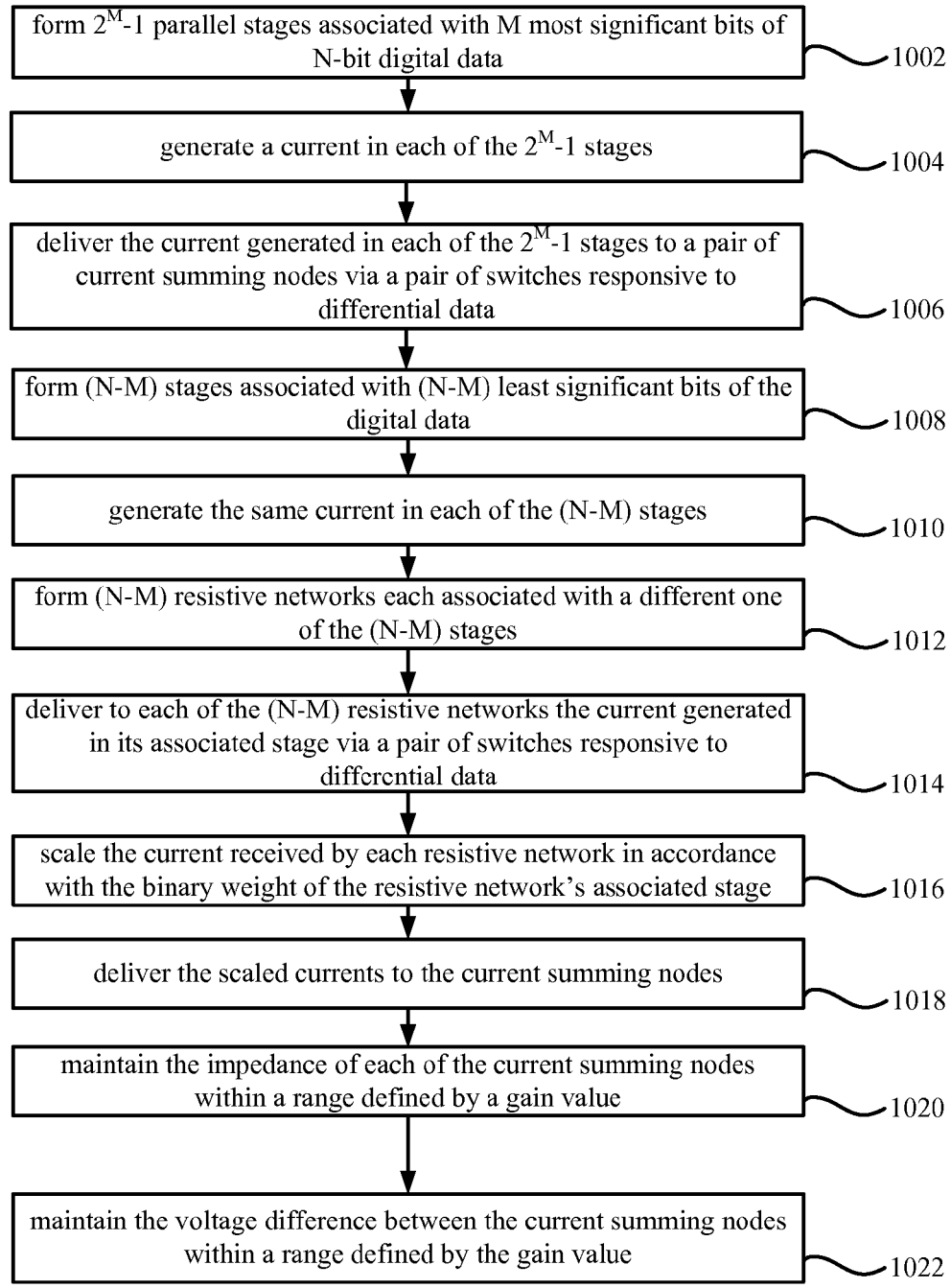
FIG. 12 is a flowchart of a method for converting a digital signal to an analog signa, in accordance with one embodiment of the present invention.

FIG. 12 is a flowchart 1000 of a method for converting an N-bit digital signal to an analog signal, in accordance with one embodiment of the present invention. To achieve this conversion, (2M–1) parallel stages associated with M most significant bits of the digital data are formed 1002. In each of the (2M–1) stages a current is generated 1004 and delivered 1006 to a pair of current summing nodes via a pair of switches that are responsive to a pair of differential data. Further in accordance with the method, (N–M) stages associated with (N–M) least significant bits of the digital data are also formed 1008. A current that has the same level as the ones generated in the (2M–1) parallel stages is also generated 1010 in each of the (N–M) stages. Also formed 1012 are (N–M) resistive networks each associated with a different one of the (N–M) stages. The current generated in each of the (N–M) stages is delivered 1014 to its associated resistive network via a pair of switches responsive to different bits of differential data. The current received by each resistive network is scaled 1016 in accordance with the binary weight of the resistive network's associated stage and delivered 1018 to the current summing nodes. The impedance of each of the current summing nodes is maintained 1020 within a range defined by a gain value. Moreover, the voltage difference between the current summing nodes is also maintained 1022 within a range defined by the gain value. The difference in the currents delivered to the current summing nodes defines the value of the converted analog signal.

The above embodiments of the present invention are illustrative and not limitative. The embodiments of the present invention are not limited by the resolution of a DAC. The embodiments of the present invention are not limited by the configuration of the resistive network, R-2R or otherwise, that may be disposed between input stage switches and the current summing nodes. The embodiments of the present invention are not limited by the type of device, wireless or otherwise, in which the DAC may be disposed. Other additions, subtractions or modifications are obvious in view of the present disclosure and are intended to fall within the scope of the appended claims.

What is claimed is:

1. An N-bit digital-to-analog converter (DAC) comprising:
   $2^M-1$ parallel stages associated with M most significant bits of the DAC, each of the $2^M-1$ stages adapted to generate a current and deliver the current to a pair of current summing nodes of the DAC via a pair of switches responsive to differential data;
   (N–M) stages associated with (N–M) least significant bits of the DAC, each of the (N–M) stages generating the current and comprising a resistive network, each of the (N–M) stages further comprising a pair of switches adapted to deliver the current generated in the stage to the stage's associated resistive network in response to differential data, each resistive network operable to scale the current it receives and deliver the scaled current defined by a binary weight of its associated stage, the (N–M) stages delivering their scaled currents to the pair of current summing nodes; and
   an impedance attenuator comprising a differential amplifier coupled to the pair of summing nodes and adapted to maintain an impedance of each of the current summing nodes and a voltage difference between the current summing nodes within a range defined by a gain of the differential amplifier.

2. The N-bit DAC of claim 1 wherein the resistive network associated with stage i of the (N–M) stages is coupled to the resistive network of stage (i+1) of the (N–M) stages, wherein i is an integer representative of a bit position of the stage within the DAC.

3. The N-bit DAC of claim 2 wherein the resistive network associated with each of the (N–M) stages receives a reference voltage.

4. The N-bit DAC of claim 1 wherein the resistive network associated with each of the (N–M) stages is an R-2R network.

5. The N-bit DAC of claim 1 wherein the impedance attenuator further comprises:
   a first PMOS transistor having a source terminal coupled to a first one of the current summing nodes, a drain terminal coupled to a first output terminal of the DAC, and a gate terminal coupled to a first output terminal of the amplifier; and
   a second PMOS transistor having a source terminal coupled to a second one of the current summing nodes, a drain terminal coupled to a second output terminal of the DAC, and a gate terminal coupled to a second output terminal of the amplifier.

6. The N-bit DAC of claim 1 wherein each of the N stages of the DAC comprises a cascode current source generating the current.

7. The N-bit DAC of claim 1 wherein the switches in each of the N stages are transistor switches, one of which transistors is responsive to a bit representative of a true data bit received by the DAC and one of which transistors is responsive to a bit representative of a complement of the bit received by the DAC, wherein the transistor switches in all N stages have a similar size.

8. The N-bit DAC of claim 7 wherein at least one of the $2^M-1$ stages comprises:
   a first resistive element disposed between a first one of the transistor switches disposed in the at least one of the $2^M-1$ stages and a first one of the current summing nodes; and
   a second resistive element disposed between a second one of the transistor switches disposed in the at least one of the $2^M-1$ stages and a second one of the current summing nodes.

9. The N-bit DAC of claim 1 wherein the resistive network associated with each of only a first subset of the (N–M) stages is an R-2R network.

10. The N-bit DAC of claim 8 wherein the resistive network associated with each of a second subset of the (N–M) stages is coupled to the current summing nodes of the DAC, said second subset not to include the first subset.

11. The N-bit DAC of claim 1 wherein at least one of the (N–M) stages comprises a voltage tracking circuit adapted to track the voltages of the current summing nodes and supply the tracked voltages to the resistive network of the at least one of the (N–M) stages.

12. The N-bit DAC of claim 11 wherein the voltage tracking circuit comprises:
   a first amplifier having a first input terminal coupled to a first one of the current summing nodes, a second input terminal coupled to a first resistive element disposed in the resistive network associated with the at least one of the (N–M) stages, and an output terminal coupled to the first amplifier's second input terminal; and
   a second amplifier having a first input terminal coupled to a second one of the current summing nodes, a second input terminal coupled to a second resistive element disposed in the resistive network associated with the at least one of the (N–M) stages, and an output terminal coupled to the second amplifier's second input terminal.

13. The N-bit DAC of claim 1 wherein at least one of the (N–M) stages comprises a distortion cancellation circuit adapted to cancel current flow between a reference voltage supplying voltage to the resistive network associated with the at least one of the (N–M) stages and the current summing nodes.

14. The N-bit DAC of claim 1 wherein each of a first subset of the (N–M) stages comprises:
   a first capacitive element coupled in parallel between terminals of a first resistive element of the resistive network associated with the stage; and
   a second capacitive element coupled in parallel between terminals of a second resistive element of the resistive network associated with the stage.

15. The N-bit DAC of claim 14 wherein the switches in each of the N stages comprise MOS transistors and wherein the first and second capacitive elements of each of the first subset of the (N–M) stages has a capacitance substantially twice a drain-to-substrate capacitance of one of the MOS transistors.

16. A digital-to-analog converter (DAC) comprising:
   a first plurality of parallel stages associated with most significant bits of the DAC, each of the first plurality of stages adapted to generate a current and deliver the current to a pair of current summing nodes of the DAC via a pair of switches responsive to differential data;
   a second plurality of stages associated with least significant bits of the DAC, each of the second plurality of stages generating the current and comprising a resistive network, each of the second plurality of stages further comprising a pair of switches adapted to deliver the current generated in the stage to the stage's associated resistive network in response to differential data, each resistive network operable to scale the current it receives and deliver a scaled current defined by a binary weight of its associated stage, the second plurality of stages delivering their scaled currents to the pair of current summing nodes; and
   an impedance attenuator comprising a differential amplifier coupled to the pair of summing nodes and adapted to maintain an impedance of each of the current summing nodes and a voltage difference between the current summing nodes within a range defined by a gain of the differential amplifier.

17. A method of converting an N-bit digital signal to an analog signal, the method comprising:
forming $2^M-1$ parallel stages associated with M most significant bits of the digital data;
generating a current in each of the $2^M-1$ stages;
delivering the current generated in each of the $2^M-1$ stages to a pair of current summing nodes via a first pair of switches responsive to differential data;
forming (N−M) stages associated with (N−M) least significant bits of the digital data;
generating the current in each of the (N−M) stages;
forming (N−M) resistive networks each associated with a different one of the (N−M) stages;
delivering to each of the (N−M) resistive networks the current generated in its associated stage via a second pair of switches responsive to differential data; scaling the current received by each resistive network in accordance with a binary weight of the resistive network's associated stage,
delivering the scaled currents to the pair of current summing nodes; maintaining an impedance of each of the current summing nodes within a range defined by a gain value; and
maintaining a voltage difference between the current summing nodes within a range defined by the gain value, the difference in the currents delivered to the current summing nodes defining a value of the analog signal.

18. The method of claim 17 further comprising:
coupling the resistive network associated with stage i of the (N−M) stages to the resistive network of stage (i+1) of the (N−M) stages, wherein i is an integer representative of a bit position of the stage within the DAC.

19. The method of claim 18 further comprising supplying a reference voltage to each of the (N−M) stages.

20. The method of claim 18 wherein the resistive network associated with each of a second subset of the (N−M) stages is coupled to the current summing nodes, said second subset not to include the first subset.

21. The method of claim 17 wherein the resistive network associated with each of the (N−M) stages is an R-2R network.

22. The method of claim 17 further comprising:
forming a cascode current source in each of the N stages; and
generating the current in each of the N stages using the cascode current source formed in the stage.

23. The method of claim 17 wherein the switches in each of the N stages are transistor switches, one of which transistors is responsive to a bit representative of a true data bit received by the DAC and one of which transistors is responsive to a bit representative of a complement of the bit received by the DAC, wherein the transistor switches in all N stages have a similar size.

24. The method of claim 23 further comprising:
coupling a first resistive element between a first one of the transistor switches of at least one of the $2^M-1$ stages and a first one of the current summing nodes; and
coupling a second resistive element between a second one of the transistor switches of the at least one of the $2^M-1$ stages and a second one of the current summing nodes.

25. The method of claim 17 wherein the resistive network associated with each of only a first subset of the (N−M) stages is an R-2R network.

26. The method of claim 17 further comprising:
tracking the voltages of the current summing nodes; and
supplying the tracked voltages to the resistive network of at least one of the (N−M) stages.

27. The method of claim 17 further comprising:
canceling current flow between a reference voltage supplying voltage to the resistive network associated with at least one of the (N−M) stages and the current summing nodes.

28. The method of claim 17 further comprising:
coupling a first capacitive element in parallel between terminals of a first resistive element of a resistive network associated with at least one of the (N−M) stages; and
coupling a second capacitive element in parallel between terminals of a second resistive element of the resistive network associated with the at least one of the (N−M) stages.

29. The method of claim 28 wherein the switches in each of the N stages comprise MOS transistors and wherein the first and second capacitive elements of each of the first subset of the (N−M) stages has a capacitance substantially twice a drain-to-substrate capacitance of one of the MOS transistors.

30. A method of converting a digital signal to an analog signal, the method comprising:
forming a first plurality of parallel stages associated with most significant bits of the digital data;
generating a current in each of the first plurality of parallel stages; delivering the current generated in each of the first plurality of parallel stages to a pair of current summing nodes via a first pair of switches responsive to differential data;
forming a second plurality of stages associated with least significant bits of the digital data;
generating the current in each of the second plurality of stages; forming a first plurality of resistive networks each associated with a different one of the second plurality of stages;
delivering to each of the first plurality of resistive networks the current generated in its associated stage via a second pair of switches responsive to differential data; scaling the current received by each of the first plurality of resistive network in accordance with a binary weight of the resistive network's associated stage,
delivering the scaled currents to the pair of current summing nodes; maintaining an impedance of each of the current summing nodes within a range defined by a gain value; and
maintaining a voltage difference between the current summing nodes within a range defined by the gain value, the difference in the currents delivered to the current summing nodes defining a value of the analog signal.

31. An N-bit digital-to-analog converter (DAC) comprising:
means for forming $2^M-1$ parallel stages associated with M most significant bits of digital data;
means for generating a current in each of the $2^M-1$ stages;
means for delivering the current generated in each of the $2^M-1$ stages to a pair of current summing nodes;
means for forming (N−M) stages associated with (N−M) least significant bits of the digital data;
means for generating the current in each of the (N−M) stages;
means for forming (N−M) resistive networks each associated with a different one of the (N−M) stages;
means for delivering to each of the (N−M) resistive networks the current generated in its associated stage;

means for scaling the current received by each resistive network in accordance with a binary weight of the resistive network's associated stage, means for delivering the scaled currents to the pair of current summing nodes;

means for maintaining an impedance of each of the current summing nodes within a range defined by a gain value; and means for maintaining a voltage difference between the current summing nodes within a range defined by the gain value, the difference in the currents delivered to the current summing nodes defining a value of the analog signal.

32. The N-bit digital-to-analog converter (DAC) of claim 31 further comprising:

means for coupling the resistive network associated with stage i of the (N–M) stages to the resistive network of stage (i+1) of the (N–M) stages, wherein i is an integer representative of a bit position of the stage within the DAC.

33. The N-bit digital-to-analog converter (DAC) of claim 32 further comprising:

means for supplying a reference voltage to each of the (N–M) stages.

34. The N-bit digital-to-analog converter (DAC) of claim 32 wherein the resistive network associated with each of only a second subset of the (N–M) stages is coupled to the current summing nodes, said second subset not to include the first subset.

35. The N-bit digital-to-analog converter (DAC) of claim 31 wherein the resistive network associated with each of the (N–M) stages is an R-2R network.

36. The N-bit digital-to-analog converter (DAC) of claim 31 further comprising:

means for forming a cascode current source in each of the N stages; and means for generating the current in each of the N stages using the cascode current source formed in the stage.

37. The N-bit digital-to-analog converter (DAC) of claim 31 wherein the switches in each of the N stages are transistor switches, one of which transistors is responsive to a bit representative of a true data bit received by the DAC and one of which transistors is responsive to a bit representative of a complement of the bit received by the DAC, wherein the transistor switches in all N stages have a similar size.

38. The N-bit digital-to-analog converter (DAC) of claim 37 further comprising:

means for coupling a first resistive element between a first one of the transistor switches of at least one of the $2^M-1$ stages and a first one of the current summing nodes; and means for coupling a second resistive element between a second one of the transistor switches of the at least one of the $2^M-1$ stages and a second one of the current summing nodes.

39. The N-bit digital-to-analog converter (DAC) of claim 31 wherein the resistive network associated with each of only a first subset of the (N–M) stages is an R-2R network.

40. The N-bit digital-to-analog converter (DAC) of claim 31 further comprising:

means for tracking the voltages of the current summing nodes; and means for supplying the tracked voltages to the resistive network of at least one of the (N–M) stages.

41. The N-bit digital-to-analog converter (DAC) of claim 31 further comprising:

means for canceling current flow between a reference voltage supplying voltage to the resistive network associated with at least one of the (N–M) stages and the current summing nodes.

42. The N-bit digital-to-analog converter (DAC) of claim 31 further comprising:

means for coupling a first capacitive element in parallel between terminals of a first resistive element of a resistive network associated with at least one of the (N–M) stages; and means for coupling a second capacitive element in parallel between terminals of a second resistive element of the resistive network associated with the at least one of the (N–M) stages.

43. The N-bit digital-to-analog converter (DAC) of claim 42 wherein the switches in each of the N stages comprise MOS transistors and wherein the first and second capacitive elements of each of the first subset of the (N–M) stages has a capacitance substantially twice a drain-to-substrate capacitance of one of the MOS transistors.

44. A digital-to-analog converter comprising:

means for forming a first plurality of parallel stages associated with most significant bits of the digital data;

means for generating a current in each of the first plurality of parallel stages;

means for delivering the current generated in each of the first plurality of parallel stages to a pair of current summing nodes;

means for forming a second plurality of stages associated with (N–M) least significant bits of the digital data;

means for generating the current in each of the second plurality stages;

means for forming a first plurality of resistive networks each associated with a different one of the second plurality of stages;

means for delivering to each of the first plurality of resistive networks the current generated in its associated stage;

means for scaling the current received by each resistive network in accordance with a binary weight of the resistive network's associated stage, means for delivering the scaled currents to the pair of current summing nodes;

means for maintaining an impedance of each of the current summing nodes within a range defined by a gain value; and means for maintaining a voltage difference between the current summing nodes within a range defined by the gain value, the difference in the currents delivered to the current summing nodes defining a value of the analog signal.

* * * * *